United States Patent
Sales Casals et al.

(10) Patent No.: US 10,365,316 B2
(45) Date of Patent: Jul. 30, 2019

(54) APPARATUS AND METHOD FOR MONITORING AN ELECTRIC POWER TRANSMISSION SYSTEM THROUGH PARTIAL DISCHARGES ANALYSIS

(75) Inventors: Lluis-Ramon Sales Casals, Milan (IT); Joaquin Del Rio Fernandez, Vilanova i la Geltru (ES); Rafael Lara, Vilanova i la Geltru (ES); Antonio Manuel Lazaro, Vilanova i la Geltru (ES)

(73) Assignee: PRYSMIAN S.p.A, Milan (IT)

( * ) Notice: Subject to any disclaimer, the term of this patent is extended or adjusted under 35 U.S.C. 154(b) by 1239 days.

(21) Appl. No.: 13/812,250

(22) PCT Filed: Jul. 26, 2010

(86) PCT No.: PCT/EP2010/004561
§ 371 (c)(1),
(2), (4) Date: Apr. 5, 2013

(87) PCT Pub. No.: WO2012/013199
PCT Pub. Date: Feb. 2, 2012

(65) Prior Publication Data
US 2013/0191049 A1 Jul. 25, 2013

(51) Int. Cl.
*G01R 31/12* (2006.01)
(52) U.S. Cl.
CPC ......... *G01R 31/12* (2013.01); *G01R 31/1272* (2013.01)
(58) Field of Classification Search
CPC ..................... G01R 31/1272; G01R 31/12
(Continued)

(56) References Cited

U.S. PATENT DOCUMENTS 5,602,709 A * 2/1997 Al-Dabbagh ........ H02H 1/0015
324/520
6,088,658 A 7/2000 Yazici et al.
(Continued)

FOREIGN PATENT DOCUMENTS

CN       1250524 A    4/2000
CN     101702001 A    5/2010
(Continued)

OTHER PUBLICATIONS

International Search Report from the European Patent Office for International Application No. PCT/EP2010/004561, dated May 23, 2011.
(Continued)

*Primary Examiner* — Yoshihisa Ishizuka
(74) *Attorney, Agent, or Firm* — Finnegan, Henderson, Farabow, Garrett & Dunner, L.L.P.

(57) ABSTRACT

A method for monitoring partial discharges in an electric power transmission system includes the steps of: detecting electric pulses from a component of the electric power transmission system, repeating a battery of different tests adapted to provide each a result indicative of partial discharge activity, the tests being continuously performed in succession one after the other in a preset period of time, each including a set of operations of acquisition and evaluations of the detected electrical pulses, and differing each other for a plurality of different combinations of values taken by test parameters used for executing the acquisition and evaluation operations; analyzing the results obtained with time by the batteries of tests executed at different execution times in the present period of time; and generating an alarm depending on the outcome of the analysis step.

16 Claims, 5 Drawing Sheets

(58) Field of Classification Search
USPC .......................................... 702/58; 324/536
See application file for complete search history.

(56) References Cited

U.S. PATENT DOCUMENTS

| | | | |
|---|---|---|---|
| 6,192,317 B1* | 2/2001 | Yazici | G01R 31/1227 324/536 |
| 6,209,048 B1* | 3/2001 | Wolff | H04L 29/06 709/203 |
| 6,313,640 B1* | 11/2001 | Nasrallah | G01R 31/1272 324/522 |
| 6,445,189 B1 | 9/2002 | Pakonen et al. | |
| 6,507,181 B1 | 1/2003 | Pakonen et al. | |
| 2003/0093126 A1* | 5/2003 | Obel | A61N 1/3712 607/27 |
| 2004/0204873 A1 | 10/2004 | Freisleben et al. | |
| 2005/0043764 A1* | 2/2005 | Wesselink | A61N 1/3627 607/9 |
| 2005/0183072 A1* | 8/2005 | Horning | G06F 21/14 717/140 |
| 2008/0147335 A1* | 6/2008 | Adest | G01D 4/004 702/64 |
| 2010/0315092 A1* | 12/2010 | Nacson | G01R 31/025 324/510 |
| 2010/0321838 A1* | 12/2010 | Wu | H02H 1/0023 361/42 |
| 2011/0291666 A1* | 12/2011 | Steineke | G01R 31/1272 324/551 |

FOREIGN PATENT DOCUMENTS

| | | | | |
|---|---|---|---|---|
| CN | 101782622 A | | 7/2010 | |
| EP | 1 094 323 A2 | | 4/2001 | |
| EP | 2204660 A1 | * | 7/2010 | ......... G01R 31/1272 |
| WO | WO 2009/011935 A1 | | 1/2009 | |
| WO | WO 2009/013638 A1 | | 1/2009 | |
| WO | WO 2009/013639 A1 | | 1/2009 | |
| WO | WO 2009/150627 A2 | | 12/2009 | |
| WO | WO 2011/012143 A1 | | 2/2011 | |
| WO | WO 2011/012146 A1 | | 2/2011 | |
| WO | WO2011012143 | * | 2/2011 | |

OTHER PUBLICATIONS

Petkovic I et al.; "Measuring System for Partial Discharge", IEEE Instrumentation and Measurement Technology Conference, 1996. IMTC-96. Conference Proceedings. Quality Measurements: The Indispensable Bridge Between Theory and Reality. IEEE Brussels, Belgium Jun. 4-6, 1996, New York, NY, USA, IEEE, US, vol. 1, Jun. 4, 1996 (Jun. 4, 1996), pp. 426-429, XP010163915.

Notification of the First Office Action from the State Intellectual Property Office of the People's Republic of China, in counterpart Chinese Application No. 201080068242.4 (dated Jul. 23, 2014).

* cited by examiner

APPARATUS AND METHOD FOR MONITORING AN ELECTRIC POWER TRANSMISSION SYSTEM THROUGH PARTIAL DISCHARGES ANALYSIS

CROSS REFERENCE TO RELATED APPLICATIONS

This application is a national phase application based on PCT/EP2010/004561, filed Jul. 26, 2010, the content of all of which is incorporated herein by reference.

BACKGROUND OF THE INVENTION

Field of the Invention

The present invention relates to an apparatus and method for monitoring an electric power transmission system, in particular a medium/high voltage electric power transmission system, through partial discharges analysis.

Description of the Related Art

Electric power transmission from a power generating plant is typically performed by means of medium/high voltage electric power transmission systems that may be aerial (overhead), terrestrial or submarine.

An electric power transmission system can comprise electric conductors (that may be aerial (overhead) conductors, insulated terrestrial conductors or insulated submarine conductors), junctions, terminations and/or insulators for aerial power systems.

A partial discharge (PD) according to IEC 60270 is a localized electrical discharge that partially bridges the insulation between conductors and that can or cannot occur adjacent to a conductor. Partial discharges are in general a consequence of local electrical stress concentrations in the insulation or on the surface of the insulation. Generally, such discharges appear as pulses having a duration of much less than 1 µs. As insulation is intended, for example, the insulating layer surrounding a conductor or an insulator for an aerial power system.

A partial discharge usually begins within voids, cracks, or inclusions within a solid dielectric, at conductor-dielectric interfaces within solid or liquid dielectrics, or in bubbles within liquid dielectrics. Partial discharges can also occur along the boundary between different insulating materials.

Partial discharges do not cause the immediate failure of the electrical insulation system, rather its progressive deterioration, ultimately leading to electrical breakdown.

It is important to detect and monitor partial discharges in an electric power transmission system in order to ensure reliable, long-term operation of the system, to predict possible failures that might lead to the interruption of the power supply service and to schedule suitable in situ checks and/or changes of the component that is generating the partial discharge activity, before its failure.

Techniques to detect and assess partial discharges in an electric power transmission system are known in the art.

WO 2009/013638 discloses a method for monitoring an activity of partial electrical discharges in an electric apparatus powered with direct voltage (DC). The method comprises the following steps, repeated in succession at predetermined time intervals: measuring analogue electrical signals and generating corresponding digital signals representative of the wave form of partial discharge impulses; deriving for each of said digital signals, T-W (equivalent time and bandwidth) parameters and an amplitude parameter; separating, by means of a fuzzy logic classifier, the set of the measured data into homogeneous sub-sets with respect to the shape parameter; correlating the sub-sets of signals having similar values of the T-W parameters and measured in successive steps; selecting the correlated sub-sets for which the amplitude parameter has a predetermined profile over time and attributing the signals of said sub-sets to partial discharge activities.

WO 2009/013639 discloses a method for detecting, identifying and locating partial discharges occurring in a discharge site along an electric apparatus comprising the following steps: detecting electrical signals in a detection station; attributing to each detected signal a value of a phase parameter; deriving for each signal T-W (equivalent time and bandwidth) parameters and an amplitude parameter; separating, by means of a fuzzy logic classifier, the set of signals detected into sub-sets that are homogeneous relative to the T-W parameters; identifying sub-sets related to partial discharges and cataloguing them; repeating the above steps in a plurality of detection stations positioned along the apparatus; correlating the sub-sets of signals detected in different detection stations and catalogued similarly; selecting as a function of the amplitude and T-W parameters a sub-set among the correlated ones and locating the partial discharges related to said sub-sets at the detection station of the selected sub-set.

US 2009/011935 discloses a method of analyzing partial discharge data collected from a group of electrical machines. In particular, the method comprises: collecting PD data; forming a W-T classification map; forming clusters of PD data according to predetermined rules; sorting each cluster into pulse classifications according to predetermined rules; generating sub-patterns from the pulse classifications; determining pulse characteristics of collected PD data; comparing Qmax levels for an electrical machine of interest with Qmax levels for other electrical machines (wherein Qmax is the maximum partial discharge charge); trending PD levels in electrical machine of interest as a function of time; determining and implementing operator notification criteria; determining and isolating PD sources internal to electrical machine of interest; determining PD levels as a function of operational data parameters.

SUMMARY OF THE INVENTION

The Applicant observed that, in general, the techniques disclosed by the above cited documents are based on probabilistic/statistical analysis and/or fuzzy classification algorithms. These techniques are complicated and expensive.

Moreover, however refined they may be, these techniques are still inaccurate because the electric power transmission system under analysis (e.g., the electric conductors, junctions and/or terminations) are susceptible to unpredictable phenomena linked to their structure and function (e.g., possible manufacturing defects, damages occurred during the laying operations, changes of the transmitted current between day and night, between various seasons of the year, between working days and non-working days, sudden changes of the transmitted current due to unforeseen events, and similar) and to the external environment (e.g. possible natural phenomena, road works, and similar), which can alter the results of the probabilistic/statistical analysis.

The Applicant faced the technical problem of providing a method and apparatus for automatically detecting and assessing partial discharges in an electric power transmission system, which is reliable and at the same time simpler and less expensive than the techniques known in the art.

As disclosed in more detail below, the Applicant found that this problem can be solved by means of a technique based on repeating, on a component of an electric power transmission system, a plurality of acquisition/evaluations operations under different settings of a monitoring apparatus, which correspond to different situations (e.g., external factors) that may affect the electric pulses assessment. The data collected from each execution of the plurality of operations are then organized as a fingerprint of the electric status of the component of the electric power transmission system at a certain time.

In particular, the Applicant found that the above technical problem can be solved by: repeating a battery of tests in a significant time window (e.g., 1 day, 1 week, 2 weeks, one month, one year and similar), each test comprising a same set of operations of acquisition and evaluations of detected electrical pulses, that differ from each other for different combinations of values taken by parameters used in the acquisition and evaluation operations; analyzing the results obtained by the executed batteries of tests; and generating an alarm depending on the outcome of said analysis, in the presence of a significant variation of the results of the batteries during said time window.

Accordingly, in a first aspect, the present invention relates to a method for monitoring partial discharges in an electric power transmission system comprising the steps of:
- detecting electric pulses emitted from a component of the electric power transmission system;
- performing on the detected electrical pulses a battery of a plurality of tests adapted to provide each a result indicative of partial discharge activity, said plurality of tests all comprising the same set of operations of acquisition and evaluations of the detected electrical pulses, said acquisition and evaluation operations being executed under conditions defined by:
- at least 2 parameters of the group comprising: trigger level, electric pulse amplification gain level, minimum electric pulse amplitude threshold $A_{min}$, minimum electric pulse phase parameter threshold $P_{min}$, maximum electric pulse phase parameter threshold $P_{max}$, test time length T, minimum number of partial discharge pulses threshold M, and
- a numerical value of said at least 2 parameters,
- the plurality of tests being executed in succession one after the other according to a predefined time sequence and being different from each other for the numerical value taken by at least one of said at least 2 parameters;
- repeating said battery of tests during a preset period of time;
- analyzing the results obtained by the batteries of tests executed in said preset period of time; and
- generating an alarm depending on the outcome of said analysis, in the presence of a variation of the results of the batteries of tests executed during said period of time.

According to a second aspect, the present invention relates to an apparatus for monitoring partial discharges in an electric power transmission system comprising:
- at least one detecting module operatively associated with a component of the electric power transmission system to receive and detect electric pulses emitted therefrom;
- an acquisition and evaluation module, connected to said detecting module, adapted to repeat, for a preset period of time, a battery of a plurality of tests on the detected electrical pulses, the tests being executed according to numerical values of at least two test parameters; preset to be at least in part different among the tests, the test parameters being selected in the group of: trigger level, electric pulse amplification gain level, minimum electric pulse amplitude threshold $A_{min}$; minimum electric pulse phase parameter threshold $P_{min}$, maximum electric pulse phase parameter threshold $P_{max}$, test time length T, minimum number of partial discharge pulses threshold M;
- an alarm generation module connected to the acquisition and evaluation module to receive the results obtained by the batteries of tests executed in said preset period of time, the alarm generation module being adapted to analyze the results of said batteries of tests to detect the presence of a variation in said results, and adapted to generate an alarm in the presence of said variation.

Preferably, said acquisition and evaluation module comprises an adjustable timing unit adapted to cause tests execution in succession one after the other according to a predefined time sequence.

The alarm generation module and the acquisition and evaluation module can be part of a single electronic processor; alternatively, the alarm generation module is a remote electronic processor connected to the acquisition and evaluation module via a data transmission system.

According to a third aspect, the present invention relates to an electric power transmission system comprising:
- a plurality of electric cables;
- a plurality of junctions between the electric cables;
- at least two terminal stations;
- at least one partial discharges monitoring apparatus associated with a component of the electric power transmission system selected from said electric cables, said junctions and said terminal stations, said partial discharges monitoring apparatus comprising:
  - at least one detecting module adapted to detect electric pulses from said component of the electric power transmission system;
  - an acquisition and evaluation module adapted to automatically repeat, for a preset period of time, a battery of a plurality of tests on the detected electrical pulses, said plurality of tests being adapted to provide each a result indicative of partial discharge activity and all comprising the same set of operations of acquisition and evaluations of the detected electrical pulses, said acquisition and evaluation operations being executed under conditions defined by at least 2 parameters and a numerical value of said at least 2 parameters, the plurality of tests being executed in succession one after the other according to a predefined time sequence and being different from each other for the numerical value taken by at least one of said at least 2 parameters;
  - an alarm generation module adapted to analyze the results obtained by the batteries of tests executed in said preset period of time; and to generate an alarm depending on the outcome of said analysis.

For the purpose of the present description and of the appended claims, except where otherwise indicated, all numbers expressing amounts, quantities, percentages, and so forth, are to be understood as being modified in all instances by the term "about". Also, all ranges include any combination of the maximum and minimum points disclosed and include any intermediate ranges therein, which may or may not be specifically enumerated herein.

The present invention, in at least one of the above mentioned aspects, can exhibit at least one of the following preferred features.

The above mentioned detection module, acquisition and evaluation module, and alarm generation module advantageously are at least one of a hardware, software and firmware module, configured to carry out the specified function.

Advantageously, said partial discharges monitoring apparatus is associated with one of said junctions.

In an embodiment, the electric power transmission system also comprises a plurality of monitoring nodes for monitoring other parameters of the electric power transmission system.

Preferably, the detecting module and the acquisition and evaluation module are located in the proximity of the said component of the electric power transmission system.

Preferably, said acquisition and evaluation module comprises an adjustable timing unit adapted to cause tests execution in succession one after the other according to a predefined time sequence.

The alarm generation module may be located in the proximity of the component of the electric power transmission system or in a remote server.

The alarm generation module and the acquisition and evaluation module can be part of a single electronic processor; alternatively, the alarm generation module is a remote electronic processor connected to the acquisition and evaluation module via a data transmission system.

Advantageously, said different values taken by said at least one parameter are representative of different situations that may affect said acquisition and evaluations operations.

Advantageously, different tests of the battery are performed on different electrical pulses. The duration of each test is preferably such as to enable detection of a significant number of partial discharge pulses. The duration of each test is preferably greater than the time period of the main supply voltage. For example, for a main supply voltage frequency of 50 Hz, the duration of each test is preferably greater than 20 ms. Preferably, the duration of each test is one order of magnitude greater than the main supply voltage time period. More preferably, it is two orders of magnitude greater than the main supply voltage time period. Even more preferably, it is three orders of magnitude greater than the main supply voltage time period.

Advantageously, the different tests are in a number at least equal to 15. Preferably, the different tests are in a number at least equal to 30, more preferably at least equal to 50, more preferably at least equal to 80, more preferably at least equal to 100. Indeed, the applicant has verified that a number of tests lower than 15 does not enable to represent a significant number of different situations that may affect the electric pulses assessment (for example different combinations of low, medium and high noise levels, weak, medium and high partial discharge levels, and so on) and, thus, to obtain reliable results. The precision and reliability in representing different and anomalous situations increases as the number of tests increases above 15.

Advantageously, the different tests are in a number such that the execution of the battery of different tests lasts at most 24 hours.

Advantageously, the analysis step comprises comparing the results obtained with time by same tests of the battery executed at different execution times during said preset period of time.

In an embodiment, the comparison step comprises the step of computing, for each of at least two predetermined time windows within said preset period of time, time averages of the results obtained in the time window by same tests executed at different execution times. Preferably, the time averages computed for the tests of the battery in one of said at least two predetermined time windows are compared with the time averages computed for corresponding tests of the battery in the other one of said at least two predetermined time windows.

Advantageously, the acquisition operations comprise at least one operations of a group comprising: electric pulse filtering, electric pulse amplification, electric pulse analogue-to-digital conversion and triggering.

Preferably, the test parameters comprise a gain level for electric pulse amplification and, for each $i^{th}$ test, wherein $1 \leq i \leq N$ and N is the number of the different tests in the battery, the acquisition operations comprise an amplification operation of the detected electric pulses, which is carried out at the gain value taken by the gain level test parameter at the $i^{th}$ test.

Preferably, the test parameters comprise a trigger level and, for each $i^{th}$ test, wherein $1 \leq i \leq N$ and N is the number of the different tests in the battery, the acquisition operations comprise a triggering operation, which is carried out at the trigger value taken by the trigger level test parameter at the $i^{th}$ test.

Advantageously, in each test, the evaluation operations are carried out on electrical pulses acquired through the acquisition operations.

Advantageously, the evaluation operations comprise comparison operations adapted to identify possible partial discharges among the electric pulses acquired through the acquisition operations. Advantageously, the comparison operations include comparisons between numeric values.

Preferably, the evaluation operations comprise comparisons between values taken by pulse parameters computed in relation to electric pulses acquired during execution of the $i^{th}$ test, wherein $1 \leq i \leq N$ and N is the number of the different tests in the battery, and values taken by corresponding test parameters at the $i^{th}$ test.

Preferably, the pulse parameters comprise at least one parameter of a group comprising: electric pulse amplitude parameter, electric pulse phase parameter, equivalent time length Te parameter, equivalent bandwidth BWe parameter, pulse energy, and pulse root mean square RMS.

Preferably, the test parameters comprise a minimum threshold $A_{min}$ for electric pulse amplitude parameter and, for each $i^{th}$ test, wherein $1 \leq i \leq N$ and N is the number of the different tests in the battery, the evaluation operations comprise comparisons between values taken by an electric pulse amplitude parameter, computed for electric pulses acquired during execution of the $i^{th}$ test, and the value taken by said minimum threshold $A_{min}$ at the $i^{th}$ test.

Preferably, the test parameters comprise a minimum threshold $P_{min}$ for electric pulse phase parameter and a maximum threshold $P_{max}$ for electric pulse phase parameter and, for each $i^{th}$ test, wherein $1 \leq i \leq N$ and N is the number of the different tests in the battery, the evaluation operations comprise comparisons between values taken by an electric pulse phase parameter, computed for electric pulses acquired during execution of the $i^{th}$ test, and the values taken by said minimum threshold $P_{min}$ and maximum threshold $P_{max}$ at the $i^{th}$ test.

Preferably, the test parameters comprise a threshold T for test time length and each $i^{th}$ test, wherein $1 \leq i \leq N$ and N is the number of the different tests in the battery, is executed for a time period corresponding to the value taken by the threshold T at the $i^{th}$ test.

Preferably, the test parameters comprise a minimum threshold M for number of partial discharges and each $i^{th}$ test, wherein $1 \leq i \leq N$ and N is the number of the different tests in the battery, returns a positive result when the number of electric pulses identified as partial discharges, among the electric pulses acquired during execution of the $i^{th}$ test, is at least equal to the value taken at the $i^{th}$ test by the minimum threshold M. The $i^{th}$ test returns a negative result when said number of electric pulses identified as partial discharges is lower than said value taken by the minimum threshold M at the $i^{th}$ test.

Preferably, the evaluation operations comprise a noise filtering operation.

The noise filtering operation can be carried out by mapping equivalent time length Te and equivalent bandwidth BWe pulse parameters computed for the acquired electric pulses in a Te-BWe model reference plane.

BRIEF DESCRIPTION OF THE DRAWINGS

The features and advantages of the present invention will be made apparent by the following detailed description of some exemplary embodiments thereof, provided merely by way of non-limiting examples, description that will be conducted by making reference to the attached drawings, wherein.

DETAILED DESCRIPTION OF THE INVENTION

Figure 1:
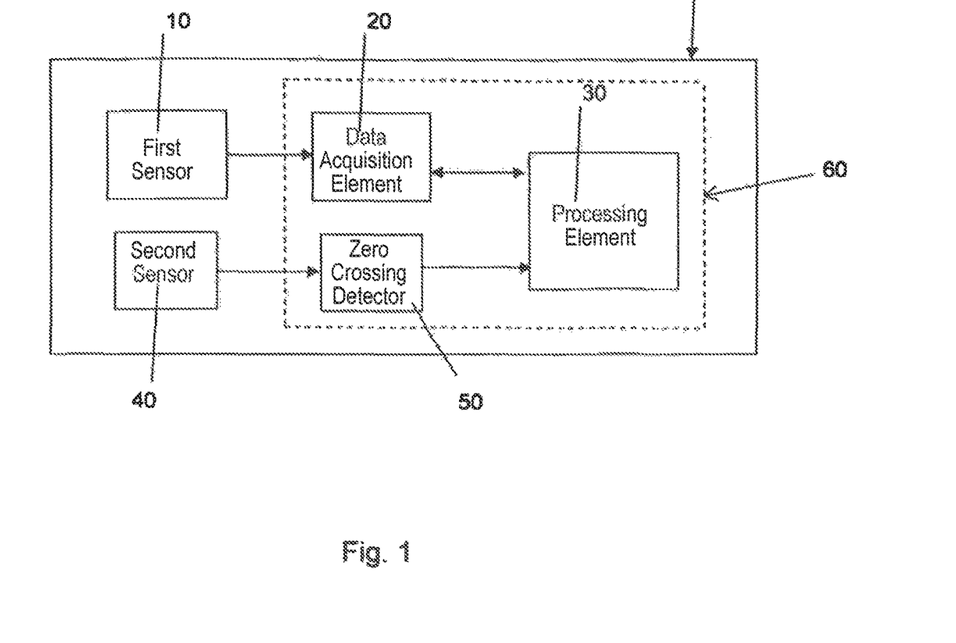
FIG. 1 schematically shows a block diagram of an embodiment of a partial discharge monitoring apparatus according to the invention.

FIG. 1 shows a block diagram of a partial discharge monitoring apparatus 1 according to an embodiment of the invention, comprising a first sensor 10, a data acquisition element 20, a processing element 30, a second sensor 40, and a zero-crossing detector 50.

Data acquisition element 20, processing element 30 and zero-crossing detector 50 make part of an acquisition and evaluation module 60.

The first sensor 10 advantageously is a high frequency (HF) sensor capable of detecting HF analogue electric pulses possibly associated with partial discharges. For example, first sensor 10 can be a conventional inductive sensor, a conventional capacitive sensor, a conventional HFCT (High Frequency Current Transformer), or an antenna acting as electric field detector as disclosed, for example, by WO 2009/150627.

The first sensor 10 advantageously is positioned on a strategic point of an electric power transmission system like, for example, a junction or a termination where partial discharges are more likely to happen.

Figure 2:
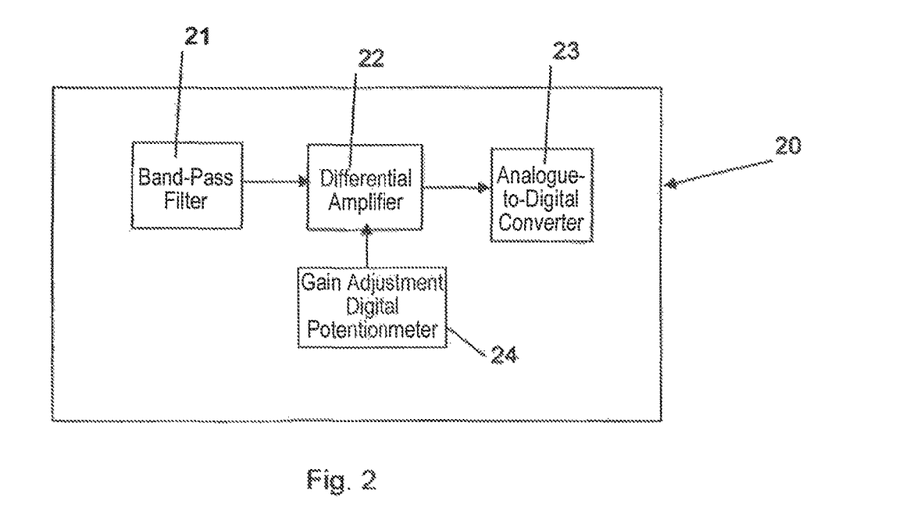
FIG. 2 schematically shows a block diagram of an embodiment of a data acquisition element of the partial discharge monitoring apparatus of FIG. 1.

As exemplarily shown in FIG. 2, the data acquisition element 20 can comprise a band-pass filter 21, a differential amplifier 22, an analogue-to-digital converter (ADC) 23 and a gain adjustment digital potentiometer 24.

The band-pass filter 21 exemplarily has a band-pass width comprised between 2 and 20 MHz. For example, the band-pass filter 21 can comprise in cascade a third order low-pass Butterworth filter having a 20 MHz cut-off frequency and a eighth order high-pass Butterworth filter having a 2 MHz cut-off frequency.

The ADC 23 is adapted to perform, according to techniques well known in the art, an analogue to digital conversion of the analogue electric pulses sensed by the first sensor 10.

The differential amplifier 22 advantageously has a gain that may be programmed digitally within a predefined range by means of the gain adjustment digital potentiometer 24, in order to enable adjustment of the analogue electric pulses sensed by the first sensor 10 to a dynamic input margin of the ADC 23.

The second sensor 40 advantageously is a low frequency (LF) sensor adapted to measure the main supply voltage of the electric power transmission system. For example, it can be a conventional inductive sensor or an electrical field detector as disclosed, for example, by WO 2009/150627. The zero-crossing detector 50 is a conventional device that comprises, for example, a voltage comparator.

The second sensor 40 together with the zero-crossing detector 50 is adapted to provide a signal, in-phase with the supply voltage (typically 50 Hz), which is useful for synchronizing the HF electric pulses measured by the first sensor 10 with the supply voltage's phase. The Applicant observes that for the synchronization it is better to measure the supply voltage with an electric field detector, which is more reliable in comparison with the inductive sensor. Indeed, the electric field detector avoids possible phase errors that may be induced by a vectorial addition of different currents that may exist in the electric power transmission system.

The processing element 30 constitutes the smart part of the apparatus 1. For example, it can be a FPGA (Field Programmable Gate Array).

The processing element 30 is adapted to control the operation of the data acquisition element 20, to process the digital data coming from the data acquisition element 20 and from the zero-crossing detector 50 and to implement an algorithm for partial discharge assessment.

Figure 3A:
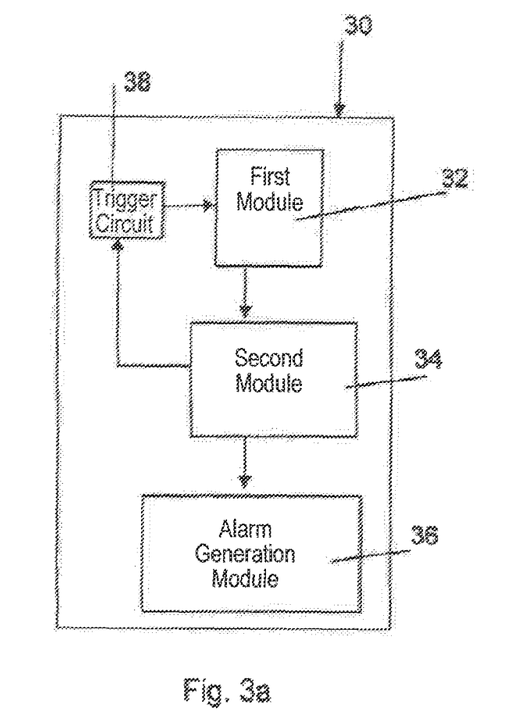
FIGS. 3a and 3b schematically show a block diagram of two embodiments of a processing element of the partial discharge monitoring apparatus of FIG. 1.

In particular, as shown in FIG. 3a, the processing element 30 comprises evaluation modules including a first module 32 and a second module 34.

Advantageously, the processing element 30 also comprises a trigger circuit 38. For example, the trigger circuit 38 can be implemented within the FPGA by means of a digital comparator comprising logic gates.

The first module 32 is adapted to process the digital data coming from the data acquisition element 20 (which correspond to the analogue electric pulses sensed by the first sensor 10) and from the zero-crossing detector 50, in order to compute pulse parameters useful for implementing the partial discharge assessment algorithm according to the invention.

The second module 34 is adapted to receive the digital data coming from the data acquisition element 20 and the pulse parameters computed by the first module 32 in order to implement the partial discharge assessment algorithm.

The apparatus 1 of the invention also comprises an alarm generation module 36 adapted to analyse the results obtained by the execution of the partial discharge assessment algorithm and to generate preventive alarms.

In particular, the alarm generation module 36 is adapted to receive the results of the partial discharge assessment algorithm in order to analyse the trend, as a function of time, of said results and to generate preventive alarms, if necessary.

Figure 3B:
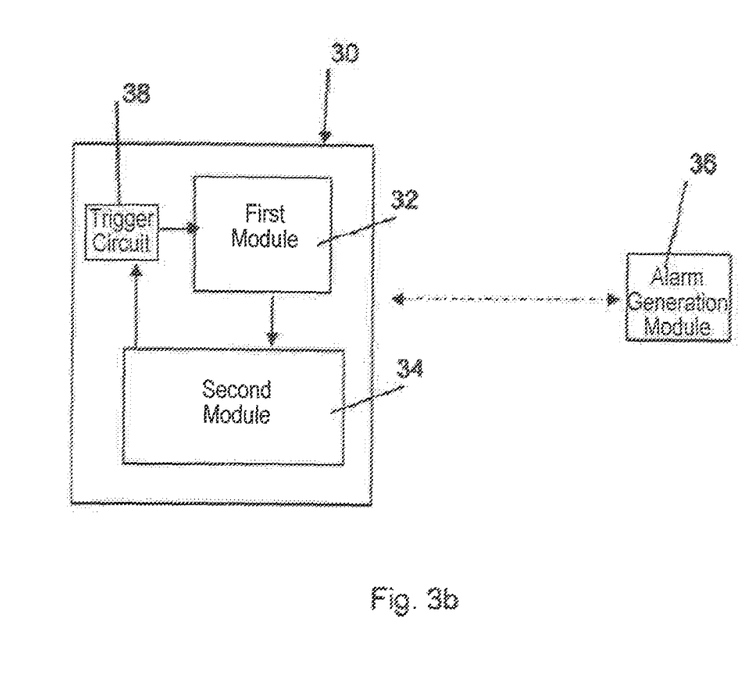

The alarm generation module 36 can be implemented either within the processing element 30 (e.g., in the above mentioned FPGA, as shown in FIG. 3a) or within a remote device (e.g., a remote server, as shown in FIG. 3b). In the latter case, the processing element 30, comprising the first module 32 and second module 34, will be adapted to send the results of the partial discharge assessment algorithm to the remote alarm generation module 36. As explain in more detail below with reference to FIG. 6, the processing element 30 can be adapted to send the said results to the remote alarm generation module 36 directly or through the intermediation of other nodes of the electric power transmission system.

The pulse parameters computed by the first module 32 for each electric pulse acquired by the data acquisition element 20 advantageously comprise an amplitude parameter (corresponding, for example, to the maximum amplitude of the electric pulse) and a phase parameter (corresponding, for example, to the phase of the supply voltage (e.g. at 50 Hz) at the time the electric pulse is detected by the first sensor 10). Preferably, the computed pulse parameters further comprise an equivalent time-length Te and an equivalent bandwidth BWe.

The pulse parameter can also comprise a pulse energy parameter and/or a pulse RMS (Root Mean Square) parameter that, for example, can be respectively computed with the following formula: $\Sigma s_i^2$ and $\sqrt{(\Sigma_{(0,N-1)} s_i^2 / nT_s)}$, wherein $s_i$ are the samples of the acquired pulse, N is the total number of samples of the acquired pulse and $T_s$ is the sampling time.

For example, Te and BWe can be computed by means of the following relationships:

$$T_e = \sqrt{\frac{\sum_{i=0}^{N-1}(t_i - t_o)^2 s_i^2}{\sum_{i=0}^{N-1} s_i^2}} \text{ with } t_o = \frac{\sum_{i=0}^{N-1} t_i s_i^2}{\sum_{i=0}^{N-1} s_i^2}$$

$$BW_e = \sqrt{\frac{\sum_{i=0}^{N-1} f_i^2 |X_i(f_i)|^2}{\sum_{i=0}^{N-1} |X_i(f_i)|^2}}$$

wherein $s_i$ is the sample of the acquired pulse detected in the instant $t_i$, N is the total number of samples of the acquired pulse, and $X_i(f_i)$ are the frequency components of the electric pulse obtained through a Discrete Fourier transform (DFT).

The calculation of pulse parameters (e.g., Amplitude, Phase, Te and BWe) is advantageously performed by the first module 32 through parallel hardware blocks specifically configured to achieve a high processing speed, whereby real time operation is guaranteed.

As explain further hereinafter, the Te and BWe pulse parameters can be useful to perform a noise filtering in order to eliminate electrical pulses generated by noise that may be greater in amplitude than the interesting partial discharges themselves, thereby helping to distinguish electric pulses that can be identified as partial discharges from noise.

When the apparatus 1 comprises a human interface, all the pulse parameters (e.g., Te, BWe, Amplitude and Phase) obtained by the first module 32 can be stored in a suitable storage area (e.g. a 512 kword SRAM, each with a 9 bit accuracy). The computed pulse parameters can also be represented in suitable Te-BWe and Amplitude-Phase planes.

The second module 34 advantageously operates in parallel to the first module 32.

According to the partial discharge assessment algorithm, the second module 34 of the processing element 30 is adapted to automatically and continuously repeat in a preset period of time a same battery of different tests (e.g., N different tests with N=128) through a Stand-Alone operating mode.

The tests are executed one after the other.

The tests differ from each other for values taken by a set of test parameters.

The test parameters define conditions under which the apparatus 1 executes the tests.

For example, the set of test parameters can comprise: the gain of the differential amplifier 22 (that can be coded in 1 byte); a trigger level for the trigger circuit 38 (that can be coded in 2 bytes); a minimum number threshold M indicating the number of partial discharge (PD) pulses necessary to generate a positive result of the test (that can be coded in 2 bytes); a time threshold T indicating the duration of a test in ms (that can be coded in 3 bytes and that preferably is an integer number of periods of the supply voltage); a minimum amplitude threshold $A_{min}$ (that can be coded in 2 bytes); a minimum phase threshold $P_{min}$ (that can be coded in 2 bytes); a maximum phase threshold $P_{max}$ (that can be coded in 2 bytes). In particular, the gain, trigger level and time threshold T parameters are used for the set up of the various components of the apparatus 1. The thresholds M, $A_{min}$, $P_{min}$ and $P_{max}$ parameters are used by assessment operations of the partial discharge assessment algorithm.

The tests can differ from each other for the values taken by all test parameters or for only part of them. For examples, the minimum phase threshold $P_{min}$, the maximum phase threshold $P_{max}$ and the time threshold T can be the same for all tests.

Each test ends with a positive (true) or negative result (false), indicating presence or absence of possible partial discharge activity.

The specific values to be taken by the test parameters in each of the tests are previously defined and stored, for example, in a flash memory.

Advantageously, the test parameters can be previously defined through an experimentation activity carried out on a plurality of components of an electric power transmission system, having different known defects in their insulation system and under a variety of different conditions (e.g., in different geographical locations, considering different external factors, different noise sources, and so on).

The experimentation activity is advantageously performed by applying the algorithm of the invention, finely varying the values of the test parameters to be used in each of the tests and collecting a substantial number of results (e.g. 2000, 3000). The results of the tests can then be statistically analyzed in order to properly select the values of the test parameters to be scheduled and stored in the apparatus 1.

Advantageously the selection is performed in order to provide an optimized setting of the apparatus 1, so that the different tests performed automatically by apparatus 1 better represent any possible situation (e.g., low, medium and high noise levels, weak, medium and high partial discharge levels, and so on).

For example, during the said selection, values of test parameters (e.g., gain values) that gave more positive results in relation to known defects are preferred with respect to those that gave negative results.

The above procedure for defining in advance the values of the test parameters to be scheduled and stored in apparatus 1 enables to obtain a set of test parameters values that are universal and usable for any component of any electric power transmission system to be monitored.

The Applicant observes that when an analysis of electric pulses is performed under the control of an operator, the operator himself/herself can finely adjust the test parameters of the testing apparatus, depending on the situations. For example, he/she can decide to increase the trigger level in case of high noise levels, he/she can decide to increase the gain of the differential amplifier if the partial discharge pulse is weak, and so on.

These intelligent decisions cannot be taken when the analysis of electric pulses is performed in automatic by an apparatus, without the intervention of an operator.

The invention overcomes this problem thanks to the partial discharge assessment algorithm wherein the electric pulses sensed by the first sensor 10 are analysed through a continuous execution of a same battery of a number N of different tests that corresponds to a corresponding number N of different setting of the apparatus 1 (that, in its turn, corresponds to a corresponding number N of different combinations of trigger levels, different gain values of the differential amplifier 22, different values of the test parameters $A_{min}$, M, T, $P_{min}$, $P_{max}$), which, as explained above, are suitably defined in advance in order to efficiently and reliably evaluate electric pulses in any possible situations (e.g., low, medium and high noise levels, weak, medium and high partial discharge levels, and so on).

In this way the reliability and accuracy of the partial discharge assessment algorithm is guaranteed even if performed automatically.

Figure 4:
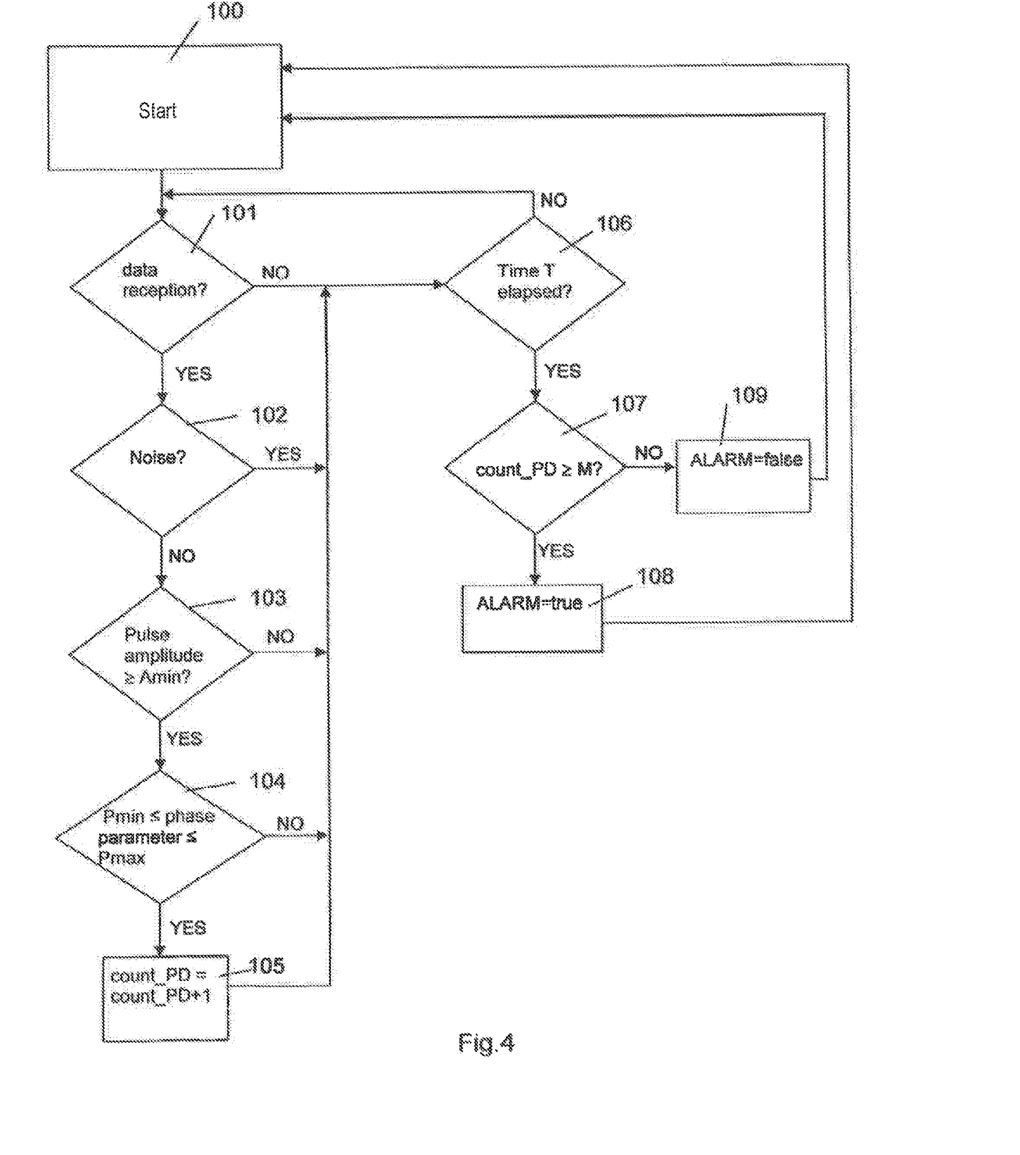
FIG. 4 schematically shows a flow chart outlining the main steps of a partial discharge assessment algorithm according to the invention.

FIG. 4 schematically shows an exemplary flow chart of a partial discharge assessment algorithm executed by the second module 34.

At block 100, at the execution of the $i^{th}$ test (with $1 \le i \le N$, wherein N is the number of tests in a battery), specific values of the test parameters for the $i^{th}$ test are read from a suitable memory (e.g., the above mentioned flash memory) and used for initializing suitable constants/variables to be used in the algorithm. In the example shown in FIG. 4, the specific values read from the flash memory are a gain value; a trigger value; a PD pulses number value; a time duration value; an amplitude threshold value; a minimum phase threshold value; and a maximum phase threshold value.

In particular, at block 100, the second module 34 uses the gain value to set the gain of the differential amplifier 22 (e.g. through the digital potentiometer 24) and the trigger value to set the trigger level at the trigger circuit 38. Moreover, the second module 34 uses the PD pulses number value to set the value of a constant M; the time duration value to set the value of a constant T; the amplitude threshold value to set the value of a constant $A_{min}$; the minimum phase threshold value to set the value of a constant $P_{min}$; and the maximum phase threshold value to set the value of a constant $P_{max}$. In addition, at block 100 a variable count PD is initialized to 0.

At block 101 reception of digital data coming from the data acquisition element 20 is continuously checked.

When no digital data are received, at block 106 it is checked if a time period T from the start of the execution of the $i^{th}$ test has elapsed. If the time period T has not elapsed, the execution of the algorithm returns to block 101. If the time period T has elapsed, the execution of the algorithm continues at block 107.

When at block 101 digital data are received, at block 102 a noise filtering operation is executed, in order eliminate known noise pulses.

For example, the filtering operation can be advantageously carried out, according to techniques known in the art, by mapping the parameters Te and BWe computed by the first module 32 for the current electric pulse in a Te-BWe model reference plane.

The model plane can, for example, be obtained by previously testing the apparatus under partial discharge and noise activities known a priori.

It is noted that according to the invention the noise filtering operation is an optional and preferred step but not necessary. Moreover, noise filtering techniques other than Te-BWe model plane mapping can be used. For example, a pulse wave-form analysis can be performed, according to techniques known in the art, for example using neuronal networks.

When at block 102 the acquired electric pulse is classified as noise, then the execution of the algorithm continues at block 106.

When at block 102 the acquired electric pulse is not classified as noise, then at block 103 the maximum amplitude parameter computed by the first module 32 for the current electric pulse is compared with $A_{min}$.

If the maximum amplitude parameter is lower than $A_{min}$ then the execution of the algorithm continues at block 106. In this way, electric pulses having maximum amplitude not exceeding the $A_{min}$ threshold are not taken into consideration for alarm generation assessment.

If the maximum amplitude parameter is higher than or equal to $A_{min}$, then at block 104 the phase parameter computed by the first module 32 for the current electric pulse is compared with $P_{min}$ and $P_{max}$.

If the phase parameter is not comprised between $P_{min}$ and $P_{max}$ then the execution of the algorithm continues at block 106. In this way, electric pulses having a phase parameter not comprised between the $P_{min}$ and $P_{max}$ thresholds are not taken into consideration for alarm generation assessment.

If the phase parameter is comprised between $P_{min}$ and $P_{max}$, then at block 105 the variable count_PD is increased by 1 (count_PD=count_PD+1) and the execution of the algorithm continues at block 106.

Accordingly, only the electric pulses that successfully pass all the checks of blocks 101 to 104 are taken into consideration for alarm generation assessment.

When at block 106 the time period T from the start of the execution of the $i^{th}$ test elapses, then at block 107 the value of the variable count_PD is compared with M.

If count_PD is lower than M, then at block 109 a variable ALARM is set to a false value (e.g. to the logic value 0).

If count_PD is higher than or equal to M, then at block 108 a variable ALARM is set to a true value (e.g. to the logic value 1). In this way, the partial discharge assessment algorithm produces a positive result only when the number of electric pulses, that during the time period T successfully passed the checks of blocks 101 to 104, exceeds the predefined value M.

Both after the execution of block 108 and block 109, the execution of the algorithm returns to block 100 to start the execution of the $i^{th+1}$ test. When the Nth test has been completed, the execution of the algorithm starts again with the first test of the battery.

The second module 34 automatically and continuously executes the N tests one after the other and sends the results of the tests to the alarm generation module 36. As stated above, when the alarm generation module 36 is hosted in a remote server, the processing element 30 can be adapted to send said test results to the remote alarm generation module 36 directly or through the intermediation of other nodes of the electric power transmission system.

Each test result sent to the alarm generation module 36 can comprise two data: the indication of the number of the test performed and the outcome of the test (true or false). In case of N=128, each test result can for example be coded in 8 bits, wherein the more significant bit can be used to indicate the outcome true (1 logic) or false (0 logic) of the test while the remaining 7 bits can be used to indicate the number of the test (from 0 to 127).

The alarm generation module 36 is adapted to receive the results of the tests from the second module 34, to store them, to analyze the results obtained over the time by same tests executed at different execution times; and to generate an alarm depending on the outcome of such analysis.

The partial discharge assessment and alarm generation procedure of the invention is based on the perception of the Applicant that partial discharge activity does not usually cause the immediate failure of the electrical insulation system but a progressive and slow deterioration of the same that may lead to electrical breakdown after a long period of time (e.g., after weeks, months or years). Therefore, the relevant data in view of alarm generation are not the result of a single test itself but the changes that the results of same tests undergone with time.

Accordingly, the analysis of the tests results is advantageously performed by the alarm generation module 36 by: monitoring the trend, as a function of time, of the results obtained by same tests executed at different execution times, recording the changes undergone with time by said results and making evaluation about activating an alarm procedure, depending on the recorded changes.

For example, the alarm generation module 36 can store, in a suitable storage area, all the results achieved by continuously executing the N tests of the battery. For each of a plurality of predetermined time windows (e.g. day by day, week by week, month by month), module 36 can compute a percentage of positive (and negative) results obtained for each of the N tests executed during the said time window. Then, through a sliding time window, module 36 can compare the percentages of positive results obtained for the N tests in a time window (e.g. at a current day) with the percentages obtained for the N tests in a previous time window (e.g. at the previous day). This enables to activate the alarm procedure when the difference in percentage for a predetermined number of tests exceeds a predetermined percentage threshold. In an embodiment, particularly advantageous when the module 36 is located in a remote server, the said predetermined number of tests and/or the said predetermined percentage threshold are parametric. In this way, their actual values can be remotely changed by an operator depending on the circumstances. For example, they can be changed (e.g. increased) when road works are made in the vicinity of the component of the electric power transmission system under test, and changed again (e.g. decreased) when the road works terminates.

Monitoring the trend, as a function of time, of the tests results guarantees that an alarm procedure is not activated in a situation wherein the tests results are distorted by temporary and unpredictable external factors (such as possible natural phenomena, road works, and similar).

Indeed, if a test result becomes true after being false for a certain period of time (e.g. a month), it is advantageous—before activating an alarm procedure—to first verify the persistency of the true result in a meaningful time period. In fact, it can happen that the test result remains true only for a limited period of time (e.g. few days)—for example because of temporary and unpredictable external factors (e.g. road works nearby the component of the electric power transmission system under control by the apparatus 1)—and that becomes again false when the external factors stop.

Therefore, according to the invention, a reliable alarm generation procedure is guaranteed even when the electric power transmission system under analysis is subjected to temporary, unpredictable phenomena.

Once established the necessity to generate an alarm, the alarm generation module 36 of the processing element 30 is advantageously adapted to activate an alarm according to techniques known in the art, for example by activating the generation of an alarm signal (e.g., sound and/or visual alarm).

In order to show the tests results that can be obtained by the partial discharge assessment algorithm executed by the apparatus of the invention, a prototype of the apparatus was arranged in a high voltage system made up of a current loop with a current reaching up to 2000 A and a voltage reaching up to 400 kV, wherein defects were introduced in the insulation system of the current loop.

The apparatus permanently operated in a stand-alone mode successively executing a programmed battery of 128 tests, each having a total duration of 20 s (T=20 s).

Figure 5:
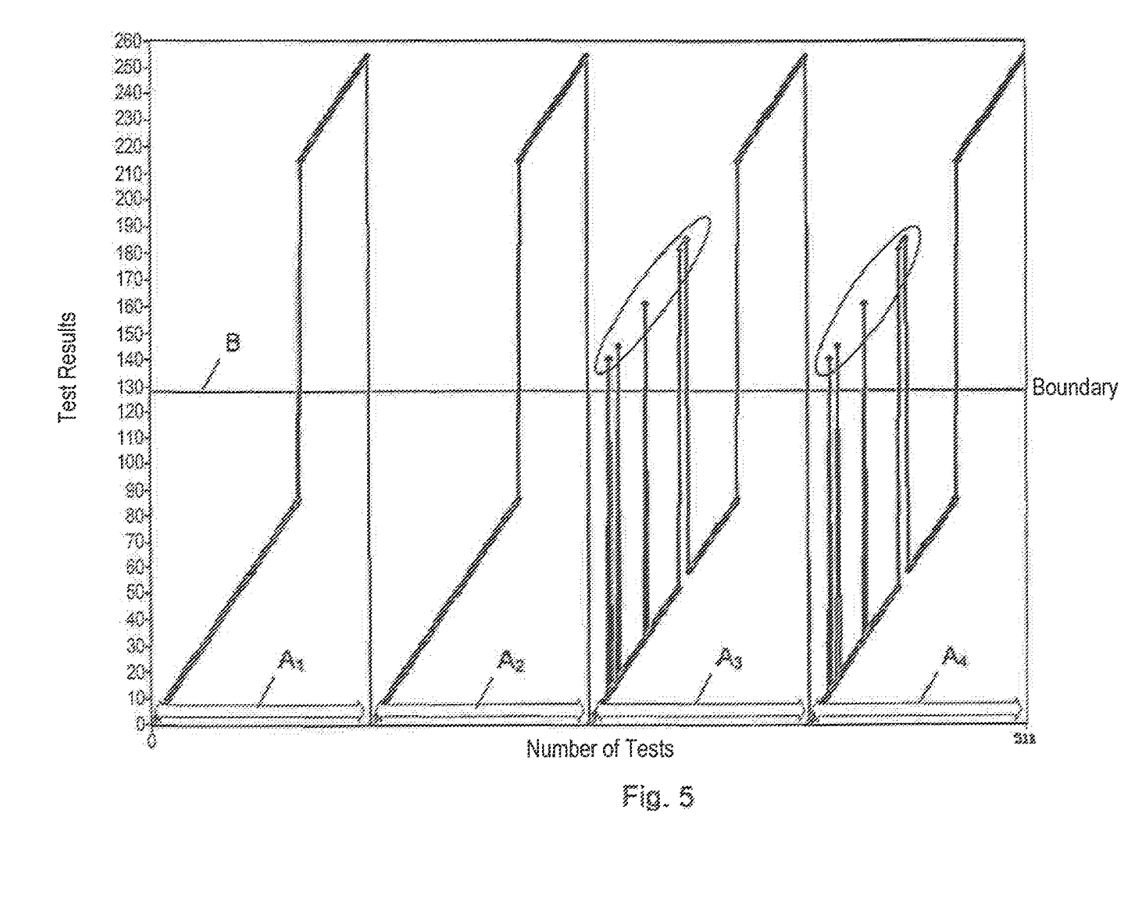
FIG. 5 shows an example of results that can be obtained by executing the partial discharge assessment algorithm of FIG. 4.

FIG. 5 is graphic representation of the results obtained by performing four times the battery of 128 tests.

In FIG. 5 the x axis represents the number of tests carried out by the partial discharge assessment algorithm. Every time a test is performed, the x axis increments one unit. The y axis indicates the test result, which—in FIG. 5—is expressed as the test number, when the test result is negative, and as the test number plus 128, when the test result is positive (for this reason the test results have an increasing test result as the number of the test increases from 0 to 127 (for a total of 128 tests).

Arrows $A_1$, $A_2$, $A_3$, $A_4$ indicate the results of the first, second, third and fourth battery of tests, respectively.

Line B represents a boundary (represented by the number 128) between positive test results and negative test results. Above line B tests results are positive, and below line B tests results are negative. Indeed, in view of what explained above, when a test from 0 to 127 has a negative result, the said negative test result is represented in the y axis with a number respectively ranging from 0 to 127. When, instead, a test from 0 to 127 has a positive result, the said positive test result is represented in the y axis with a number respectively ranging from 0+128 to 127+128.

In the experiments carried out by the Applicant, the first and second battery of 128 tests were performed in normal condition, in absence of defects in the insulation system of the current loop used for the experiments. At the execution of the third battery of tests, a defect was introduced in the insulation system.

FIG. 5 shows that the partial discharge assessment algorithm suddenly reacted to the new defect. Indeed, 6 tests of the battery, initially giving a negative result, started to give a positive result at the third and fourth execution of the battery of tests (see the circled tests results in FIG. 5).

The apparatus of the invention can be used to monitor any component of an electric power transmission system. As partial discharge activities are usually more frequent at junctions and/or terminations, apparatuses of the invention can advantageously be used in an electric power transmission system in association with junctions and/or terminations.

Figure 6:
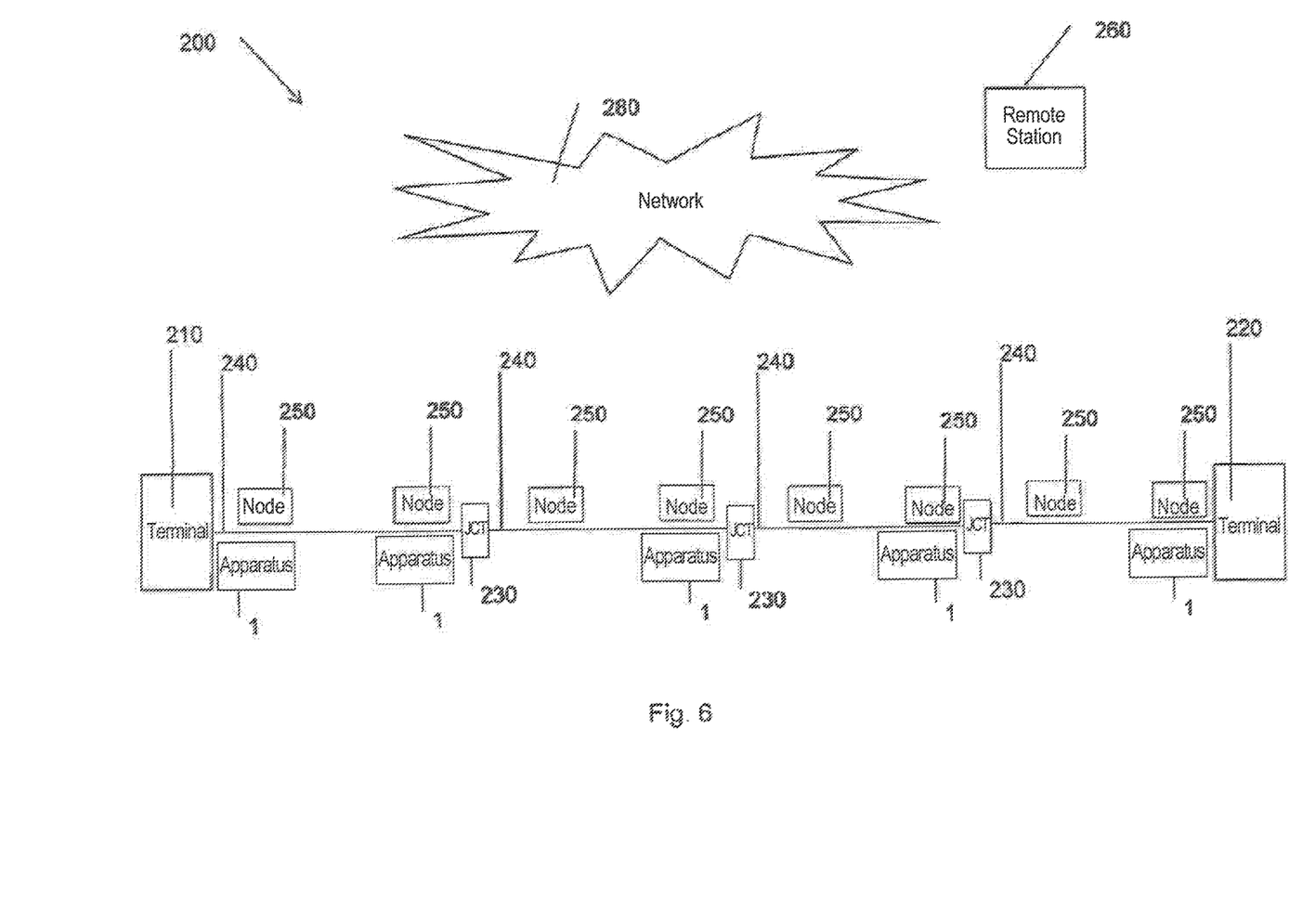
FIG. 6 shows a block diagram of an embodiment of an electric power transmission system according to the invention.

FIG. 6 shows an example of an electric power transmission system 200 comprising a first terminal 210, a second terminal 220, a plurality of junctions 230, a plurality of electric cables 240 between two junctions 230 or between a terminal 210, 220 and a junction 230, and a plurality of apparatuses 1 according to the invention, associated with terminals 210, 220, cables 240 and junctions 230.

The electric cables 240 can be high or medium voltage electric cables.

The term medium voltage is used to indicate voltages of from 1 to 35 kV.

The term high voltage is used to indicate voltages higher than 35 kV.

The electric power transmission system 200 can be, for example, of the terrestrial or submarine type.

The electric cables 240 can comprise at least one core comprising an electric conductor surrounded by at least one insulating layer, and at least one protective sheath. Optionally, the core further comprises at least one semiconductive layer and a metal screen.

The core can be a single phase core.

In AC systems, the electric cables 240 advantageously are three-phase cables, each comprising three insulated single phase cores.

The three insulated cores can be protected together within a single sheath or they can be individually protected within three separate sheaths.

As described above, the apparatuses 1 according to the invention are adapted to detect and evaluate partial discharges and to activate an alarm in case of need.

The alarm can be sent from the apparatuses 1 to a central remote station 260 through techniques known in the art as, for example, through suitable radio frequency (RF), fiber optic, GSM/GPRS and/or wired electric links.

The electric power transmission system 200 is also advantageously equipped with a monitoring system comprising a plurality of monitoring nodes 250 positioned in association with the junctions 230, electric cables 240 and terminals 210, 220 of the electric power transmission system 200. The monitoring nodes 250 are adapted to monitor various parameters (such as cable temperature, ambient temperature, ambient humidity, water flooding, cable current, screen current, cable voltage, fire, gas, aperture of access doors, cable strain, cable displacement, vibrations, and similar) of the electric power transmission system 200 and to transmit the collected data to the remote station 260.

The apparatuses 1 according to the invention can be adapted to communicate the alarm signals directly to the remote station 260 or, in alternative, to the closest monitoring node 250, which in its turns will be adapted to transmit the alarm signal to the remote station 260.

For example, the monitoring system can advantageously be of the type disclosed in the patent application PCT/EP2009/005520, wherein the monitoring nodes 250 are connected to each other in cascade through a plurality of data links and are adapted to alternatively operate in a sleeping mode and in an active mode so that the data acquired by the monitoring nodes during active modes are sent towards a central unit (not shown) by making the data pass from one monitoring node to another, by starting from the monitoring nodes that generate the output data till a last monitoring node, which forwards the output data to the central unit. The central unit collects the output data coming from all monitoring nodes 250 and transmits them to the remote station 260. The central unit can be connected to a modem or a router (not shown) for communicating with the remote station 260, according to a predetermined communication protocol.

Communications between the central unit and the remote station 260 can be in part performed through a GSM/GPRS network 280.

The data links between the monitoring nodes 250 and between the last monitoring node and the central unit can be wired (e.g., optical or electrical links) or wireless (e.g. RF links).

According to another embodiment (not shown), apparatuses 1 according to the invention and, optionally, monitoring nodes 250 can be installed in a substation (e.g., an urban substation), comprising terminal parts of a plurality of cables belonging to a same or different electric power transmission systems, in order to monitor the terminal parts of said plurality of cables. For example, they can be installed so that each terminal part to be monitored is coupled to at least one apparatus 1 and one monitoring node 250.

The apparatuses 1 and/or the monitoring nodes 250 can advantageously be supplied by a remote main power source, for example through a suitable electric supply line.

The apparatuses 1 and/or the monitoring nodes 250 are preferably supplied by local energy generators (not shown) that advantageously produce electric energy by exploiting local sources like generative forces located in the electric power transmission system or in the environment where the system operates as, for example, a magnetic field generated by the alternate current (AC) flowing along an electric cable of the cable system, vibrations, sunlight.

The local electric energy generators may, for example, be of the photovoltaic type (in case of aerial cable system) or of the vibration type (adapted to transform cable vibrations into electric energy).

According to a preferred embodiment of the invention, the local electric energy generators are of the magnetic type, adapted to transform the magnetic field generated by an alternating current flowing along an AC cable of the electric power transmission system into electric energy.

Preferably, the local electric energy generators are of the type described in the patent application PCT/EP2009/005508, comprising an arc shaped ferromagnetic body extending along a longitudinal axis and at least one electrically conducting winding wound around the ferromagnetic body to form turns in planes substantially perpendicular to the arc.

It is reminded that the invention includes both the case wherein the first module 32, the second module 34 and the alarm generation module 36 are all located in a same location (that is, in the apparatus 1 in the proximity of the component of the electric power transmission system under monitoring) and the case wherein the said modules are in part located in the proximity of the component under monitoring and in part (e.g., the alarm generation module 36) remotely, for example at the remote station 260.

The invention claimed is:

1. A method for identifying and assessing over time partial discharges of electric power in an electric power transmission system, performed by an electrical apparatus coupled to the electric power transmission system, the method comprising:

detecting, by electrical sensing equipment, electric pulses emitted from a component of the electric power transmission system;

performing a set of tests by data acquisition and evaluation circuitry, each test in the set being executed in succession on different ones of the detected electrical pulses according to a predefined time sequence, each test in the set providing an indication of partial discharge activity and comprising an acquisition process and an evaluation process on the detected electrical pulses, wherein:

a first test parameter and a second test parameter are applied against the different ones of the detected electrical pulses for each test in the set to identify the presence of pulse discharge activity, the first test parameter and the second test parameter being selected from a group of: trigger level, electric pulse amplification gain level, minimum electric pulse amplitude threshold, minimum electric pulse phase parameter threshold, maximum electric pulse phase parameter threshold, test time length, and minimum number of partial discharge pulses threshold, and         the acquisition process and the evaluation process being the same for each test in the set but for a value of the first test parameter, the value of the first test parameter being different for each test in the set;

repeating, by the data acquisition and evaluation circuitry, said set of tests during a preset period of time to obtain results;

analyzing, by the data acquisition and evaluation circuitry, the results;

generating, by the data acquisition and evaluation circuitry, an alarm depending on an outcome of said analysis, in the presence of a variation within the results; and     arranging a change of the component depending on the outcome of said analysis.

2. The method according to claim 1, wherein the analyzing the results comprises comparing first test results obtained in one predetermined time window with second test results of a previous predetermined time window within said preset period of time.

3. The method according to claim 2, wherein the comparing the first and second test results comprises computing, for each of the one predetermined time window and the previous predetermined time window within said preset period of time, time averages of the first and second test results obtained by tests executed at different times with identical values for the first and the second test parameters.

4. The method according to claim 3, wherein the time averages computed for the one predetermined time window are compared with the time averages computed for the previous predetermined time window.

5. The method according to claim 1, wherein the acquisition process comprises at least one of: electric pulse filtering, electric pulse amplification, and electric pulse analogue-to-digital conversion and triggering.

6. The method according to claim 1, wherein at least one of the first and the second test parameters comprises the electric pulse amplification gain level and, for each $i^{th}$ test, wherein $1<i<N$ and N is a number of the tests in the set, the acquisition process comprises amplification of the detected electric pulses, the amplification being carried out at the value that the electric pulse amplification gain level test parameter has at the $i^{th}$ test.

7. The method according to claim 1, wherein at least one of the first and the second test parameters comprises the trigger level and, for each $i^{th}$ test, wherein $1<i<N$ and N is a number of the tests in the set, the acquisition process comprises triggering, the triggering being carried out at the value that the trigger level test parameter has at the $i^{th}$ test.

8. The method according to claim 1, wherein the evaluation process comprises comparisons adapted to identify possible partial discharges among the detected electric pulses acquired through the acquisition process.

9. The method according to claim 1, wherein the evaluation process comprises comparisons between pulse parameters computed in relation to the electric pulses acquired during execution of the $i^{th}$ test, wherein $1<i<N$ and N is the number of the tests in the set, the pulse parameters being selected among electric pulse amplitude, electric pulse phase, equivalent time length, equivalent bandwidth, pulse energy, and pulse root mean square.

10. The method according to claim 1, wherein at least one of the first and the second test parameters comprises the minimum number of partial discharge pulses threshold and wherein each $i^{th}$ test returns a positive result when a number of electric pulses identified as partial discharges, among the detected electric pulses acquired during the $i^{th}$ test, is higher than or equal to the value that the minimum number of partial discharge pulses threshold has for the $i^{th}$ test, wherein $1 \leq i \leq N$ and N is the number of the tests in the set.

11. The method according to claim 10, wherein the $i^{th}$ test returns a negative result when said number of electric pulses identified as partial discharges is lower than said value that the minimum number of partial discharge pulses threshold has at the $i^{th}$ test.

12. The method of claim 1, wherein a value of the second test parameter is different for each test in the set.

13. The method of claim 12, wherein, in addition to the first and second test parameters, a plurality of other test parameters are applied against the corresponding different ones of the detected electrical pulses for each test in the set to identify the presence of pulse discharge activity, the plurality of other test parameters being selected from the group of: trigger level, electric pulse amplification gain level, minimum electric pulse amplitude threshold, minimum electric pulse phase parameter threshold, maximum electric pulse phase parameter threshold, test time length, and minimum number of partial discharge pulses threshold, the values of the other test parameters being different for each test in the set.

14. An apparatus for identifying and assessing over time partial discharges of electric power in an electric power transmission system comprising:

electrical sensing equipment comprising at least one detecting module operatively associated with a component of the electric power transmission system to receive and detect electric pulses emitted therefrom;

electronic circuitry comprising:

an acquisition and evaluation module connected to said at least one detecting module adapted to repeat, for a preset period of time, a set of tests on different ones of detected electrical pulses to obtain results, each test in the set of tests being executed in succession according to a predefined time sequence and by applying at least one of an acquisition process and an evaluation process to identify the presence of pulse discharge activity, wherein
- a first test parameter and a second test parameter are applied against the different ones of the detected electrical pulses for each test to identify the presence of pulse discharge activity, the first test parameter and a second test parameter being selected from a group of: trigger level, electric pulse amplification gain level, minimum electric pulse amplitude threshold, minimum electric pulse phase parameter threshold, maximum electric pulse phase parameter threshold, test time length, and minimum number of partial discharge pulses threshold, and
- the acquisition process and the evaluation process being the same for each test in the set of tests but for a value of the first test parameter, the value of the first test parameter being different for each test in the set of tests;

an alarm generation module connected to the acquisition and evaluation module to receive the results obtained by said set of tests repeated in said preset period of time, the alarm generation module being adapted to analyze the results to detect the presence of a variation in said results, and being adapted to generate an alarm in the presence of said variation, wherein the set of tests executed by the acquisition and evaluation module is configured so as to provide a result indicative of presence or absence of possible partial discharge activity.

15. An electric power transmission system comprising:
a plurality of electric cables;
a plurality of junctions between the plurality of electric cables;
at least two terminal stations;
at least one partial discharge monitoring apparatus configured according to the apparatus of claim 14, associated with the component of the electric power transmission system, the component being selected from said plurality of electric cables.

16. The apparatus according to claim 14, wherein the values of the first and the second test parameters are representative of settings of the apparatus.

* * * * *